(12) United States Patent
White et al.

(10) Patent No.: US 10,367,112 B2
(45) Date of Patent: Jul. 30, 2019

(54) DEVICE FOR DIRECT X-RAY DETECTION

(71) Applicant: Nokia Technologies Oy, Espoo (FI)

(72) Inventors: Richard White, Cambridge (GB); Chris Bower, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/575,158

(22) PCT Filed: May 18, 2016

(86) PCT No.: PCT/FI2016/050329
§ 371 (c)(1),
(2) Date: Nov. 17, 2017

(87) PCT Pub. No.: WO2016/193531
PCT Pub. Date: Dec. 8, 2016

(65) Prior Publication Data
US 2018/0145204 A1    May 24, 2018

(30) Foreign Application Priority Data
Jun. 4, 2015   (EP) ..................................... 15170737

(51) Int. Cl.
*H01L 27/146* (2006.01)
*H01L 31/115* (2006.01)
*H01L 31/0352* (2006.01)

(52) U.S. Cl.
CPC ...... *H01L 31/115* (2013.01); *H01L 27/14609* (2013.01); *H01L 27/14659* (2013.01);
(Continued)

(58) Field of Classification Search
None
See application file for complete search history.

(56) References Cited

U.S. PATENT DOCUMENTS

2007/0057144 A1    3/2007  Asano
2008/0110494 A1*   5/2008  Reddy ............. H01L 31/035272
                                                                136/255
(Continued)

FOREIGN PATENT DOCUMENTS

GB       2473696        3/2011
WO    2004/109807 A2   12/2004
(Continued)

OTHER PUBLICATIONS

Konstantatos et al., "Hybrid Graphene—Quantum Dot Phototransistors With Ultrahigh Gain", Nature Nanotechnology, vol. 7, 2012, pp. 363-368.
(Continued)

*Primary Examiner* — Charles D Garber
*Assistant Examiner* — Alia Sabur
(74) *Attorney, Agent, or Firm* — Alston & Bird LLP

(57) ABSTRACT

A device for direct X-ray detection (516) comprises a plurality of substantially parallel conductive channels (501) separated from one another by a quantum dot material (510), thereby forming a composite material layer (517). The parallel conductive channels (501) are electrically connected to source and drain electrodes (503 504*a*) which enable a flow of electrical current through the conductive channels (501). The quantum dot material (510) generates electron hole pairs upon exposure to incident electromagnetic radiation and the thus generated charge results in an electric field which causes a change in electrical current passing through at least one of the conductive channels (501). The change in electrical current is indicative of one or more of the presence and magnitude of the incident electromagnetic radiation. Since the conductive channels (501) are oriented in a direction perpendicular to the plane of the substrate (502), the distances between the conductive channels can be cho-
(Continued)

sen under consideration of the diffusion lengths of the generated charge carriers and independently from the thickness of the composite material layer (517) required for X-ray radiation.

19 Claims, 5 Drawing Sheets

(52) U.S. Cl.
CPC .............. *H01L 27/14696* (2013.01); *H01L 31/035218* (2013.01); *H01L 31/035227* (2013.01)

(56) References Cited

U.S. PATENT DOCUMENTS

| 2012/0223291 A1* | 9/2012 | Klem | B82Y 10/00 |
| | | | 257/21 |
| 2013/0049738 A1* | 2/2013 | Sargent | H01L 31/035218 |
| | | | 324/96 |

FOREIGN PATENT DOCUMENTS

| WO | 2009/085351 A2 | 7/2009 |
| WO | 2009099259 | 8/2009 |
| WO | 2009156419 | 12/2009 |

OTHER PUBLICATIONS

"X-Ray Mass Attenuation Coefficients", NIST, Retrieved on Nov. 23, 2017, Webpage available at : https://physics.nist.gov/PhysRefData/XrayMassCoef/chap2.html.

Tobias, "Spectral Enhancement of Organic Photodetectors", KIT Scientific Publishing, Jun. 24, 2014, 246 pages.

"New Nanowire Transistors May Help Keep Moore's Law Alive", Nanoscale, Phys.org, Retrieved on Nov. 23, 2017, Webpage available at : https://phys.org/news/2013-05-nanowire-transistors-law-alive.html.

"X-Ray Radiation Window With Carbon Nanotube Frame", Ideas, Inventions and Innovations, Retrieved on Nov. 23, 2017, Webpage available at : http://www.ineffableisland.com/2010/07/x-ray-radiation-window-with-carbon.html.

Juan et al., "Semiconducting Oxide Nanowires: Growth, Doping and Device applications", Nanowires—Implementations and Applications, Jul. 18, 2011, 41 pages.

Isacsson et al., "Parametric Resonances in Electrostatically Interacting Carbon Nanotube Arrays", Physical Review, vol. 79, No. 16, Apr. 14, 2009, pp. 165418-1-165418-11.

Extended European Search Report received for corresponding European Patent Application No. 15170737.9, dated Dec. 8, 2015, 12 pages.

International Search Report and Written Opinion received for corresponding Patent Cooperation Treaty Application No. PCT/FI2016/050329, dated Aug. 9, 2016, 17 pages.

\* cited by examiner

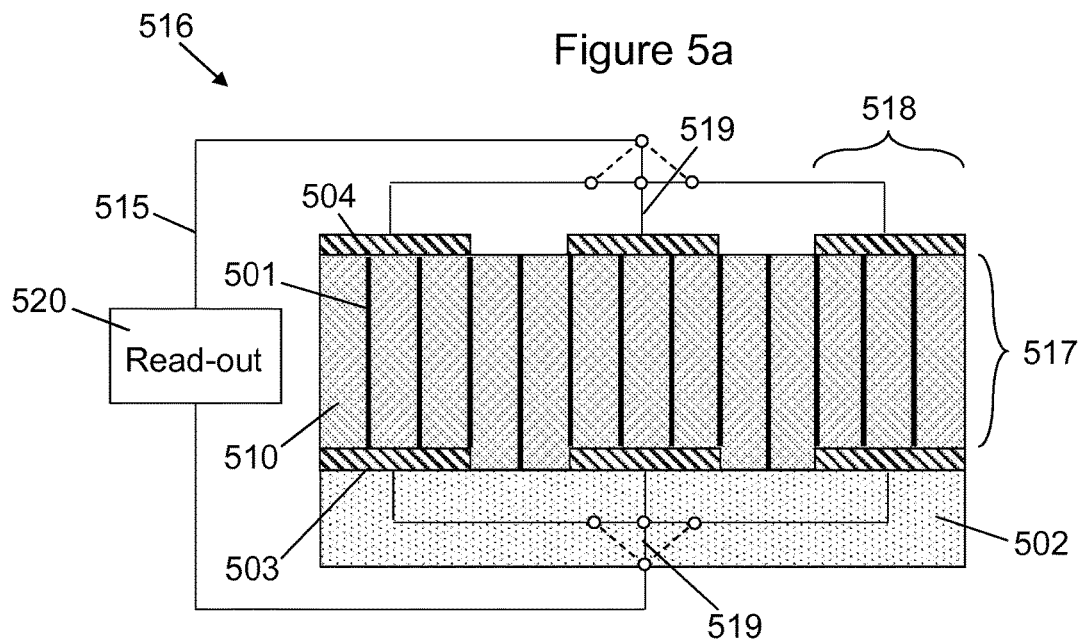
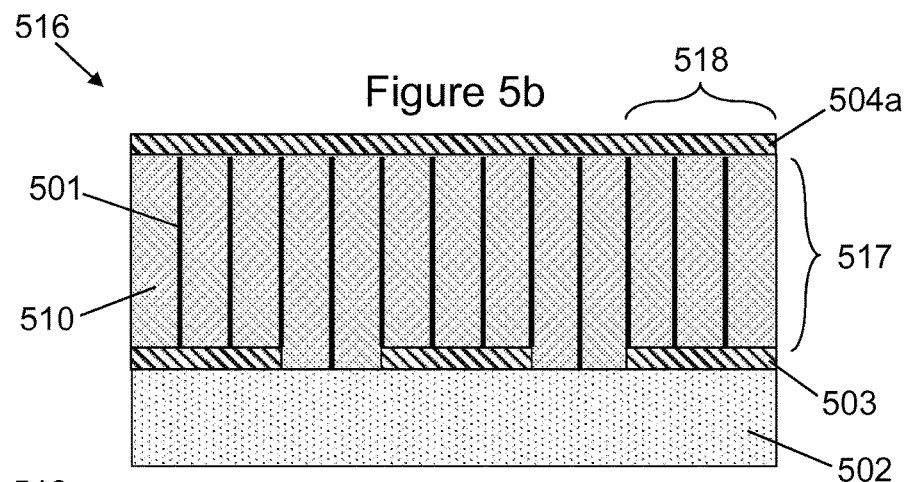
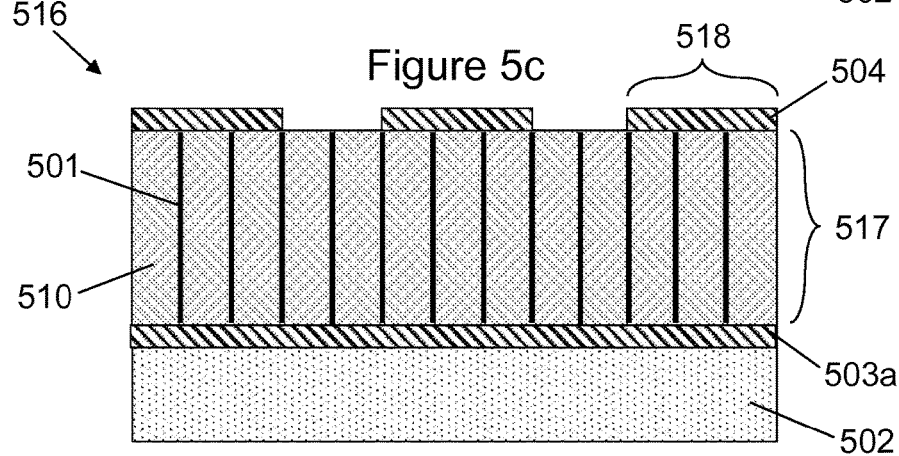

DEVICE FOR DIRECT X-RAY DETECTION

RELATED APPLICATION

This application was originally filed as PCT Application No. PCT/FI2016/050329 filed May 18, 2016, which claims priority benefit from EP Application No. 15170737.9 filed Jun. 4, 2015.

TECHNICAL FIELD

The present disclosure relates to the field of photodetectors, associated methods and apparatus, and in particular concerns an apparatus comprising a plurality of substantially parallel conductive channels separated from one another by a quantum dot material for use in detecting one or more of the presence and magnitude of incident electromagnetic radiation. Certain disclosed example aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Photodetectors which can detect higher energy electromagnetic radiation such as X-rays are used in medical and engineering applications.

The listing or discussion of a prior-published document or any background in this specification should not necessarily be taken as an acknowledgement that the document or background is part of the state of the art or is common general knowledge.

SUMMARY

According to a first aspect, there is provided an apparatus comprising a plurality of substantially parallel conductive channels separated from one another by a quantum dot material, and source and drain electrodes configured to enable a flow of electrical current through the conductive channels, wherein the quantum dot material is configured to generate charge on exposure to incident electromagnetic radiation, the generated charge producing an electric field which causes a change in electrical current passing through at least one of the conductive channels, the change in electrical current indicative of one or more of the presence and magnitude of the incident electromagnetic radiation.

The apparatus may comprise a plurality of source and drain electrode pairs, each pair of source and drain electrodes associated with one or more channels.

The apparatus may comprise a plurality of source electrodes each associated with a respective drain electrode.

The apparatus may comprise a plurality of source electrodes each associated with the same drain electrode, or a plurality of drain electrodes each associated with the same source electrode.

The source and drain electrodes may each have a substantially planar configuration and be connected to opposite longitudinal ends of the conductive channels, and the conductive channels may extend substantially perpendicular to the respective planes of the source and drain electrodes.

The apparatus may comprise a substrate configured to support the conductive channels, quantum dot material and source and drain electrodes, and either the source electrode(s) or drain electrode(s) may be formed on the supporting substrate.

The conductive channels may extend substantially perpendicular to the surface of the supporting substrate.

The conductive channels may extend substantially vertically during use of the apparatus in determining one or more of the presence and magnitude of the incident electromagnetic radiation.

The conductive channels and quantum dot material may together form a layer of composite material having a thickness of greater than 1 µm, 5 µm, 10 µm, 15 µm, 20 µm, 25 µm, 50 µm, 75 µm, 100 µm or 1 mm.

The conductive channels may have a length of more than 1 µm, 5 µm, 10 µm, 15 µm, 20 µm, 25 µm, 50 µm, 75 µm, 100 µm or 1 mm.

The conductive channels may be laterally spaced apart from one another by no more than 10 nm, 25 nm, 50 nm, 100 nm, 200 nm, 500 nm or 1 µm.

The quantum dot material may be configured to generate charge on exposure to one or more of the following types of electromagnetic radiation: x-rays, visible light, ultraviolet light and infrared radiation.

The conductive channels may comprise one or more of graphene, carbon nanotubes and semiconductor nanowires (e.g. silicon or zinc oxide).

Each conductive channel may be formed from a respective carbon nanotube, and the quantum dot material may be further provided within the carbon nanotubes.

The quantum dot material may comprise a plurality of quantum dots formed from one or more of PbS, CdSe, CdS, PbSe, ZnO, ZnS, CZTS, $Cu_2S$, $Bi_2S_3$, $Ag_2S$, HgTe, CdSe, CdHgTe, InAs, InSb, PbTe, CdTe, InP, ZnSe, CdSeTe, ZnSeS, ZnHgSe, ZnSeTe Ge and ClS.

The quantum dot material may comprise a plurality of quantum dots separated from one another by ligands, and the ligands may have a chain length which is sufficiently short to facilitate charge transfer between neighbouring quantum dots.

The ligands may have a chain length of no more than 0.1 nm, 0.25 nm, 0.5 nm, 0.75 nm, 1 nm or 1.25 nm.

The ligands may comprise one or more of 1,2-ethanedithiol, methylamine, ethylamine, ethylene diamine, ethanethiol, propanethiol, 1,3-benzenedithiol, hydrazine, formic acid, oxalic acid, acetic acid, pyridine, butylamine, formamide, SnSa, $PbBr_2$, $PbI_2$, $PbCl_2$, Na2S.9H2O and KOH.

The apparatus may comprise a read-out circuit configured to address each pair of source and drain electrodes individually.

The read-out circuit may comprise one or more of a thin-film transistor and a complementary metal-oxide-semiconductor transistor.

The apparatus may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a sensor, a camera, an image sensor, a photodetector, a phototransistor, a flat panel array comprising a plurality of detection pixels, and a module for one or more of the same.

According to a further aspect, there is provided a method of making an apparatus, the method comprising:
- forming a plurality of substantially parallel conductive channels;
- depositing a quantum dot material between the conductive channels; and
- forming source and drain electrodes configured to enable a flow of electrical current through the conductive channels, wherein the quantum dot material is configured to generate charge on exposure to incident electromagnetic radiation, the generated charge producing an electric field which causes a change in electrical current passing through at least one of the conductive channels, the change in electrical current indicative of one or more of the presence and magnitude of the incident electromagnetic radiation.

According to a further aspect, there is provided a method of using an apparatus,
- the apparatus comprising a plurality of substantially parallel conductive channels separated from one another by a quantum dot material, and source and drain electrodes configured to enable a flow of electrical current through the conductive channels, wherein the quantum dot material is configured to generate charge on exposure to incident electromagnetic radiation, the generated charge producing an electric field which causes a change in electrical current passing through at least one of the conductive channels, the change in electrical current indicative of one or more of the presence and magnitude of the incident electromagnetic radiation,
- the method comprising determining one or more of the presence and magnitude of incident electromagnetic radiation based on a detected/measured change in electrical current passing through at least one of the conductive channels.

The steps of any method disclosed herein do not have to be performed in the exact order disclosed, unless explicitly stated or understood by the skilled person.

Corresponding computer programs (which may or may not be recorded on a carrier) for implementing one or more of the methods disclosed herein are also within the present disclosure and encompassed by one or more of the described example embodiments.

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

FIG. 5a illustrates schematically one example of the present apparatus;

FIG. 5b illustrates schematically another example of the present apparatus;

FIG. 5c illustrates schematically another example of the present apparatus;

DESCRIPTION OF SPECIFIC ASPECTS/EMBODIMENTS

One or more disclosed embodiments of the present apparatus relate to field-effect transistors (FETs). An FET is a type of transistor in which an electrical current passes through a channel, the conductance (or conductivity) of which is controlled by a transverse electric field.

Figure 1:
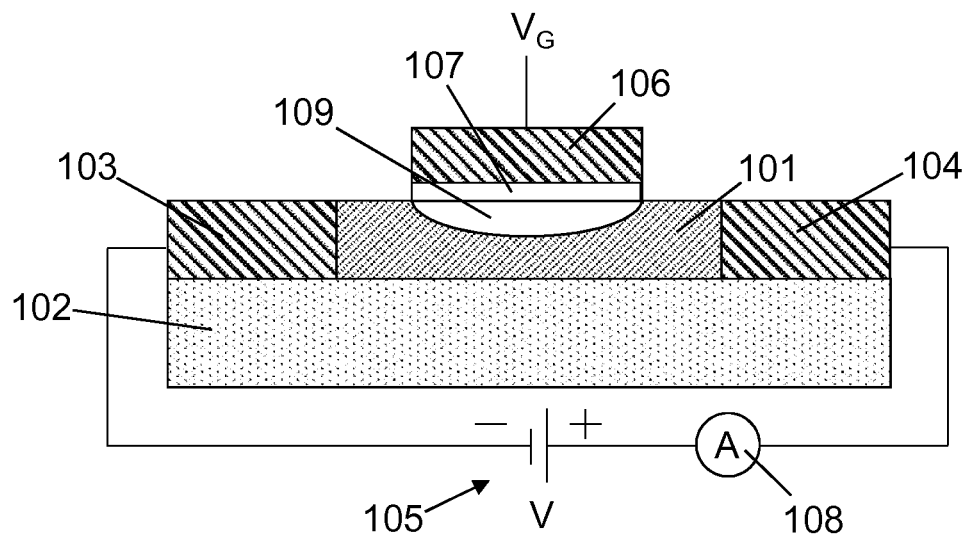
FIG. 1 illustrates schematically a conventional field-effect transistor.

FIG. 1 shows a conventional FET in cross-section. As shown in this figure, a semiconductor channel 101 (such as p-type silicon) is supported on a substrate 102 and connected to metal source 103 and drain 104 electrodes. An electrical current enters and leaves the channel 101 via the source 103 and drain 104 electrodes, respectively, by applying a potential difference (V) 105 across the channel 101. The conductance of the channel 101 between the source 103 and drain 104 electrodes is switched on and off by a third electrode (the gate electrode 106) capacitively coupled through a thin dielectric layer 107. The conductance may be determined by measuring the current through the channel 101 (using an ammeter 108, for example) and dividing by the potential difference (V) 105. With p-type silicon (or another p-type semiconductor), application of a positive gate voltage ($V_G$) depletes the charge carriers (creating a depletion region 109 in the channel 101) and reduces the conductance, whilst applying a negative gate voltage ($V_G$) leads to an accumulation of charge carriers (creating a conductive region) and an increase in conductance.

Figure 2:
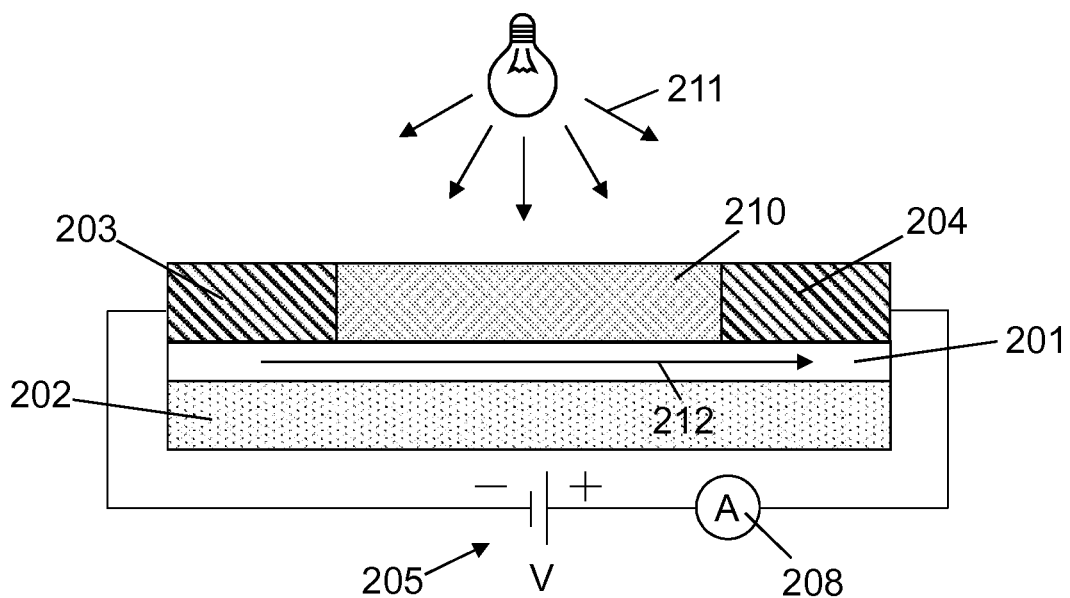
FIG. 2 illustrates schematically a photodetector comprising a quantum dot field-effect transistor.

FIG. 2 shows an FET-based photodetector. Rather than using a gate electrode to vary the flow of electrical current through the channel, the photodetector uses a quantum dot material 210 which is configured to generate electron-hole pairs on exposure to incident electromagnetic radiation 211. Depending on the band alignment of the quantum dot material 210 with the underlying channel 201, either the electron or the hole is transferred by diffusion to the channel 201 leaving the other charge carrier trapped in the quantum dot material 210 to electrostatically gate the device. The resulting change in electrical current 212 is therefore indicative of the presence and/or magnitude of the incident electromagnetic radiation 211. Quantum dot photodetectors have demonstrated exceptional performance for the detection of infrared radiation. In principle, quantum dots should allow such devices to be used over a wide range of wavelengths. In practice, however, the responsivity of these photodetectors is dependent on the thickness of the quantum dot layer 210.

Figure 3:
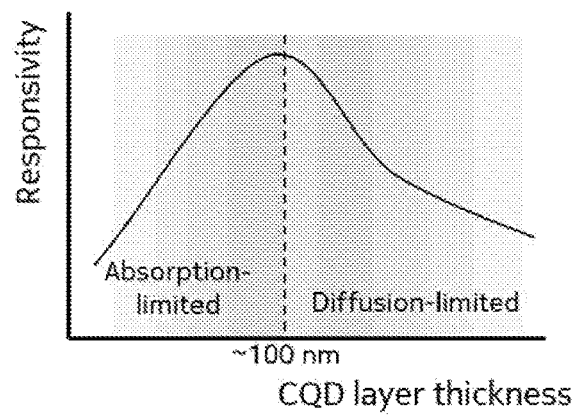
FIG. 3 illustrates schematically how the responsivity of the photodetector of FIG. 2 typically varies with the thickness of the quantum dot layer.

FIG. 3 shows how the responsivity of existing quantum dot photodetectors varies with the thickness of the (colloidal) quantum dot layer. As the thickness decreases, the quantum dot layer becomes less efficient at absorbing the incident electromagnetic radiation (i.e. it is absorption limited). As the thickness increases, on the other hand, the distance that the generated charge carriers have to travel to reach the channel also increases resulting in a greater probability of charge recombination (i.e. it is diffusion limited). The optimum thickness depends on the dynamics of the charge carriers, which itself is dependent upon the quantum dot material, the surface states of the quantum dots and the ligands attached thereto. In the case of PbS quantum dots with ethanedithiol ligands, a quantum dot layer of around 100 nm in thickness is suitable. This thickness is sufficient for detecting visible light and infrared radiation (typical quantum efficiency of 25-30%), but is unsuitable for detecting higher energy radiation such as X-rays.

Figure 4:
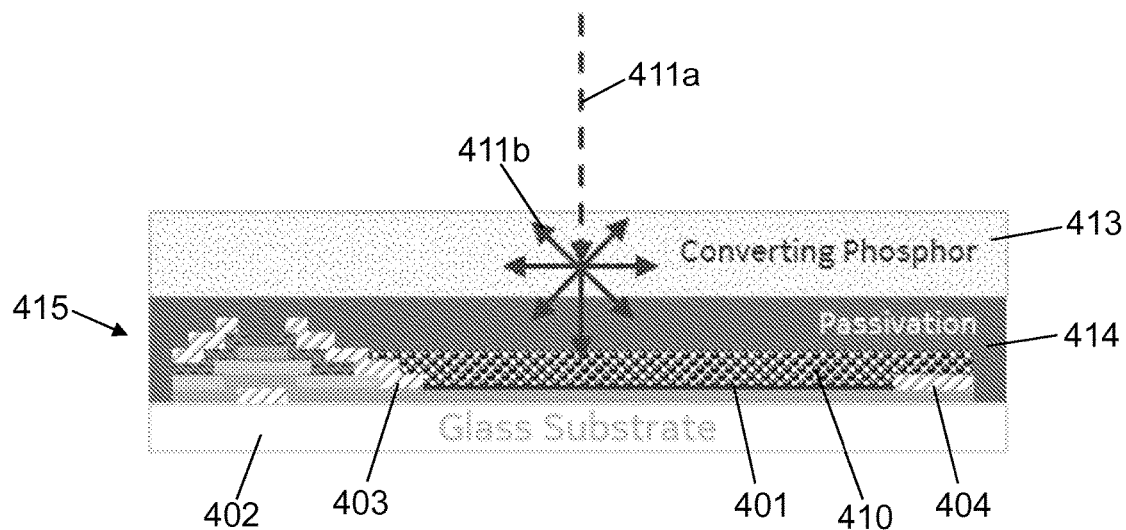
FIG. 4 illustrates schematically an X-ray detector comprising a converting phosphor in combination with a quantum dot field-effect transistor.

FIG. 4 shows an existing photodetector which is capable of detecting X-rays. In addition to the quantum dot material 410, channel 401, source 403 and drain 404 electrodes and supporting substrate 402, the detector comprises a phosphor 413 or scintillator layer on top of the quantum dot material 410 for converting the incident X-rays 411a into visible light photons 411b. For example, thallium-doped CsI scintillators emit at around 550 nm. The emitted light photons 411b are then absorbed by the quantum dot material 410 to produce electron-hole pairs as discussed above. In this example, the photodetector also comprises a passivation layer 414 to protect the quantum dots and electronics from the phosphor 413 and surrounding environment, as well as a thin-film transistor (TFT) read-out circuit 415.

Whilst the photodetector shown in FIG. 4 has proven to be effective at detecting incident X-rays 411a, it would be beneficial from an overall detection efficiency perspective if the X-rays 411a could be absorbed and converted directly into electrical charge without the intermediate conversion into visible light photons 411b. Furthermore, the phosphor 413 or scintillator layer tends to cause spreading of the incident electromagnetic radiation 411 which can result in crosstalk between adjacent pixels and therefore a decrease in the spatial resolution of the device. There will now be described an apparatus and associated methods that may provide a solution to one or more of these issues.

FIG. 5a shows one example of the present apparatus 516. The apparatus 516 comprises a plurality of substantially parallel conductive channels 501 separated from one another by a quantum dot material 510, and source 503 and drain 504 electrodes configured to enable a flow of electrical current through the conductive channels 501. The quantum dot material 510 is configured to generate charge on exposure to incident electromagnetic radiation, the generated charge producing an electric field which causes a change in electrical current passing through at least one of the conductive channels 501. This change in electrical current is indicative of one or more of the presence and magnitude of the incident electromagnetic radiation. For qualitative detection, the mere determination of a change in current (or conductivity/conductance) by a predefined amount may be sufficient to deduce the presence of the incident electromagnetic radiation. For quantitative detection, on the other hand, the intensity of electromagnetic radiation versus current (or conductivity/conductance) would typically need to be precalibrated.

By separating the conductive channels 501 from one another by the quantum dot material 510, the quantum dots and conductive channels 501 become integrated with one another to form a layer of composite material 517. In this way, the diffusion length of the generated charge carriers is limited by the spacing of the conductive channels 501 rather than the thickness of the layer 517. As a result, provided that the conductive channels 501 are in sufficiently close proximity to one another to reduce the chance of electron-hole recombination (e.g. laterally spaced by no more than 1 µm), the composite layer 517 can be formed with the necessary thickness for absorbing the target electromagnetic radiation (e.g. greater than 1 µm, 10 µm, 100 µm or 1 mm) without a corresponding decrease in responsivity. The wavelengths which are detectable using the present apparatus 516 are therefore dictated primarily by the material used to form the quantum dots (discussed in more detail later), and may include one or more of X-rays, visible light, ultraviolet light and infrared radiation.

The illustrated apparatus 516 also comprises a substrate 502 configured to support the conductive channels 501, quantum dot material 510 and source 503 and drain 504 electrodes, and a read-out circuit 515 connected to the source 503 and drain 504 electrodes. The source electrodes 503 are formed on the surface of the supporting substrate 502 and the drain electrodes 504 are formed on top of the composite material 517, although their positioning could be reversed. Furthermore, the source 503 and drain 504 electrodes each have a substantially planar configuration and are connected to opposite longitudinal ends of the conductive channels 501 such that the conductive channels 501 extend substantially perpendicular to the respective planes of the source 503 and drain 504 electrodes. By "sandwiching" the composite material 517 between the source 503 and drain 504 electrodes, substantially all of the surface area is active for photodetection in contrast to existing photodetectors comprising lateral electrode configurations where the electrode areas normally constitute inactive regions.

The electrodes 504 on the upper surface of the composite material 517 (the drain electrodes in FIG. 5a) are also conveniently configured to be substantially transparent to at least the electromagnetic radiation of interest to enable interaction with the underlying quantum dot material 510, and in some cases, may be configured to be substantially opaque to other wavelengths of electromagnetic radiation to help prevent false readings. In other cases, the electrodes 504 on the upper surface of the composite material 517 may not be transparent to the electromagnetic radiation of interest. In this scenario, the apparatus may only detect electromagnetic radiation that is incident between adjacent electrodes (for example). Additionally or alternatively, the apparatus 516 may comprise a separate layer of material (not shown) to filter the electromagnetic radiation. The particular material used to form the electrodes 503, 504 (and separate layer) will therefore depend on the type of electromagnetic radiation being detected. Examples of electrode materials include gold, silver, copper, aluminium, carbon, graphene and indium tin oxide.

The apparatus 516 is arranged such that the conductive channels 501 extend substantially perpendicular to the surface of the supporting substrate, i.e. substantially parallel to the incident electromagnetic radiation. Therefore, when electromagnetic radiation is incident upon the upper surface of the apparatus 516, the mobile charge carriers can diffuse laterally to the nearest channel(s) 501 leaving the trapped charge carriers of opposite polarity to gate the flow of current through these respective channels 501. In this way, each conductive channel 501 has the potential to serve as a separate pixel 518 of a photodetector (although in practice, each pixel 518 may comprise several conductive channels 501 depending on the electrode arrangement and readout circuitry 515) for detecting not only the presence and/or magnitude of the electromagnetic radiation, but also the location/position of the incident photons on the surface of the apparatus 516. Furthermore, because of the substantially vertical channel arrangement, the incident electromagnetic radiation has a greater chance of generating charge carriers. This is due to the smaller percentage of the incident area occupied by the conductive channels 501 and the greater thickness of photo-sensitive material when compared to a horizontal channel arrangement.

In the example shown in FIG. 5a, the apparatus comprises a plurality of source 503 and drain 504 electrode pairs. In this case, each source electrode 503 is associated with a respective drain electrode 504 and each pair of electrodes 503, 504 is configured for use with several conductive channels 501. The spatial resolution may, however, be increased by increasing the density of channels 501 and electrodes 503, 504 (e.g. by decreasing the diameter and spacing of the channels 501 and the area of the electrodes 503, 504). As an example, the conductive channels 501 may have a diameter of no more than 10 nm, 25 nm, 50 nm, 100 nm, 250 nm, 500 nm or 1 μm, and they may be laterally spaced apart from one another by no more than 10 nm, 25 nm, 50 nm, 100 nm, 200 nm, 500 nm or 1 μm. In addition, the source 503 and drain 504 electrodes may have an in-plane area of no more than 50 nm, 100 nm, 250 nm, 500 nm, 1 μm, 10 μm, 100 μm or 1 mm.

As illustrated in FIG. 5a, the read-out circuit 515 is configured to address each pair of source 503 and drain 504 electrodes individually. This allows each pixel 518 of the apparatus 516 to be read out separately, and may be achieved using switches 519 to connect the relevant electrodes 503, 504 to a measurement device 520. Such switches 519 may be formed from one or more of a TFT (as shown in FIG. 4) and a complementary metal-oxide-semiconductor (CMOS) transistor.

FIGS. 5b and 5c show further examples of the present apparatus 516. In the example of FIG. 5b, the plurality of drain electrodes 504 on top of the composite material 517 are replaced by a single drain electrode 504a. Each electrode pair 503, 504 therefore comprises a respective source electrode 503 in combination with the common drain electrode 504a. Similarly, in the example of FIG. 5c, the plurality of source electrodes 503 on top of the supporting substrate 502 are replaced by a single source electrode 503a. Each electrode pair 503, 504 therefore comprises the common source electrode 503a in combination with a respective drain electrode 504. The use of a common source 503a or drain 504a electrode simplifies the fabrication process because the electrode material can be deposited as a continuous layer without the need for additional lithographic patterning steps.

A number of different fabrication processes may be used to form the plurality of substantially parallel conductive channels 501. One method is to deposit an array of vertically-aligned carbon nanotubes (conductive channels) on top of an aluminium foil (common source 503a or drain 504a electrode) using plasma-enhanced chemical vapour deposition. Alternatively, an array of vertically-aligned semiconducting nanowires (conductive channels 501) may be grown via a vapour-liquid-solid mechanism in a vacuum deposition system using gold nanoparticles as catalysts. In this scenario, the gold nanoparticles used to catalyse the reaction may be used to form separate source 503 or drain 504 electrodes. Another method is to form a structured template (e.g. from silicon or nanoporous anodic aluminium oxide) and then deposit a layer of metal (such as copper or nickel) on top of the template to serve as a catalyst for growing graphene (conductive channels 501) via CVD. Rather than using a catalyst layer, the graphene could be deposited directly onto the structured template using atomic layer deposition. A further process involves the deposition of a graphene or carbon nanotube ink through a porous mesh to produce a dense array of substantially vertical asperities (conductive channels 501) on the surface of a substrate (supporting substrate 502 or common electrode 503a, 504a). Although this process is relatively simple, the resulting channels 501 would have diameters on the microscale rather than nanoscale, which may limit the spatial resolution of the device compared to the other techniques mentioned above.

Once the plurality of substantially parallel conductive channels 501 have been formed, a quantum dot solution can then be deposited (e.g. via a microfluidic pump) directly into the channel structure. When the conductive channels 501 are formed from carbon nanotubes, the quantum dot solution may be deposited within the carbon nanotubes as well as between the carbon nanotubes. This feature is advantageous in the sense that it increases the amount of quantum dot material 510 within the composite material 517 and therefore increases the probability of charge generation during interaction of the incident electromagnetic radiation with the composite material 517.

In this example, the quantum dot solution comprises a plurality of quantum dots separated from one another by primary ligands. The primary ligands are used to passivate the reactive surface of the quantum dots and reduce their aggregation within the solution, and are typically long-chain (~2 nm) fatty acids such as oleic acid which make the quantum dots soluble in non-polar organic solvents such as toluene. By controlling the surface energy of the conductive channels 501 and the quantum dot solution, the quantum dot solution can effectively fill the volume between the conductive channels 501 by capillary action.

The deposited quantum dots must be sufficiently close-packed to enable charge transfer therebetween. The long-chain primary ligands can, however, hinder the formation of a close-packed quantum dot material and may therefore need to be replaced by shorter-chain secondary ligands (e.g. having a chain length of no more than 0.1 nm, 0.25 nm, 0.5 nm, 0.75 nm, 1 nm or 1.25 nm). This can be achieved by passing a ligand-exchange solution through the composite material 517. After ligand replacement has occurred, a rinse solution may optionally be deposited to remove the longer-chain primary ligands and any excess shorter-chain secondary ligands. Removal of the longer-chain primary ligands from the composite material 517 helps to prevent their reattachment to the quantum dots. In some cases, one or more of the deposition, ligand-exchange and rinse steps may need to be performed several times to achieve the desired result. This may be carried out by a programmed sequence of microfluidic pumps delivering each solution in turn. In other cases, the quantum dots may be separated from one another in solution by shorter-chain ligands which allow direct deposition without the need for ligand replacement. In this scenario, the quantum dot solution may need to be deposited shortly after dispersion of the quantum dots within the solvent to reduce aggregation thereof. Once the deposition process is complete, the composite material 517 may be heated (or simply left for a predetermined period of time at room temperature) to allow any solvents to evaporate.

The quantum dots themselves may comprise one or more of PbS, CdSe, CdS, PbSe, ZnO, ZnS, CZTS, $Cu_2S$, $Bi_2S_3$, $Ag_2S$, HgTe, CdSe, CdHgTe, InAs, InSb, PbTe, CdTe, InP, ZnSe, CdSeTe, ZnSeS, ZnHgSe, ZnSeTe Ge and CIS; the longer-chain primary ligands may comprise one or more of oleic acid, oleate, trioctylphosphine oxide, alkylphosphonic acid, fatty acid or long-chain alkylamine; and the shorter-chain secondary ligands may comprise one or more of 1,2-ethanedithiol, methylamine, ethylamine, ethylene diamine, ethanethiol, propanethiol, 1,3-benzenedithiol, hydrazine, formic acid, oxalic acid, acetic acid, pyridine, butylamine, formamide, $SnS_4$, $PbBr_2$, $PbI_2$, $PbCl_2$, Na2S.9H2O and KOH. As one particular example, the quantum dot solution may comprise PbS quantum dots having oleic acid primary ligands within a toluene solvent, the ligand-exchange solution may comprise 1,2-ethanedithiol secondary ligands within an acetonitrile solvent, and the rinse solution may comprise one or more of toluene and acetonitrile.

One reason why quantum dots are suitable as optically sensitive materials is because they have a relatively narrow absorption wavelength that can be controlled by changing the size and material of the quantum dots, and they exhibit a relatively high quantum efficiency. Nevertheless, the mass attenuation of particular materials for different wavelengths of electromagnetic radiation needs to be considered. A narrow beam of monoenergetic X-rays with an incident intensity "$I_0$" penetrating a layer of material with mass thickness x, density ρ and attenuation coefficient μ emerges with intensity I given by the exponential attenuation law:

$$I/I_0 = \exp[1(\mu/\rho)x] \quad \text{Equation 1}$$

which can be rewritten as:

$$\mu/\rho = x^{-1}\ln(I_0/I) \quad \text{Equation 2}$$

from which μ/ρ can be obtained from measured values of $I_0$, I and x. The mass thickness x is defined as the mass per unit area, and is obtained by multiplying the thickness t by the density ρ. Using PbS quantum dots as an example, at 30 keV, μ/ρ=25.2 $cm^2/g$. Therefore, for $I_0/I$>100 (i.e. 99% of incident X-rays absorbed), x>0.183 $g/cm^2$ and therefore t>240 μm (density of PbS is 7.6 $g/cm^3$ assuming a homogeneous layer of PbS). Therefore, a 240 μm thick layer of PbS quantum dots is required to absorb 99% of the incident 30 keV X-rays.

Figure 6:
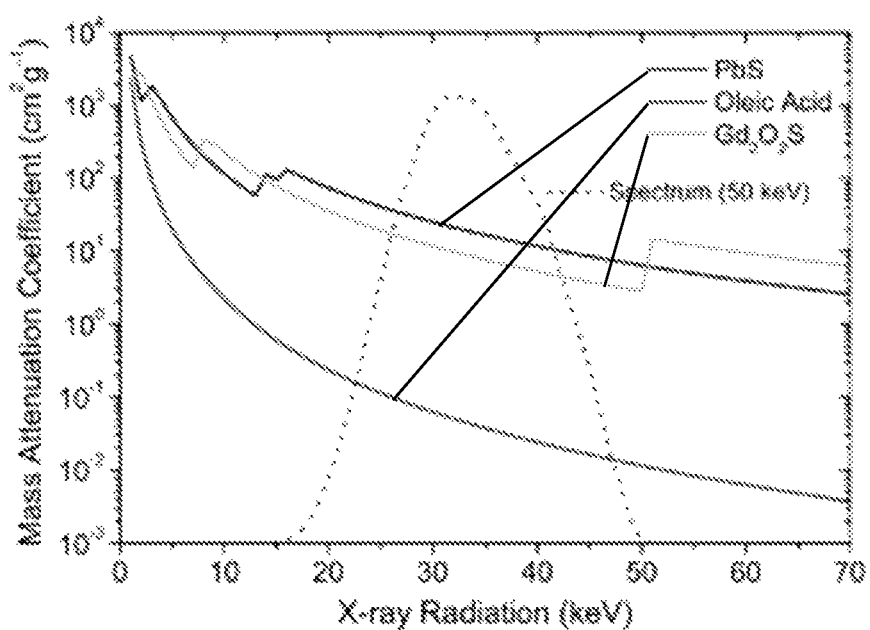
FIG. 6 illustrates schematically the variation in X-ray absorption with energy for various materials.

FIG. 6 shows the mass attenuation factor for the photoelectric absorption of X-rays by PbS, oleic acid and $Gd_2O_2S$ with respect to a 50 kV spectrum (taken from T. Rauch, "Spectral Enhancement of Organic Photodetectors", KIT Scientific Publishing, Karlsruhe, ISBN: 9783731501541 (2014)). The neglect of the photoelectric absorption of oleic acid can clearly be seen. Both PbS and $Gd_2O_2S$ inherently have X-ray absorption coefficients in the same order of magnitude.

Although other semiconductor materials may be used for the quantum dots (as mentioned above), the mass attenuation coefficient at the electromagnetic radiation energies of interest should be maximised. In this regard, compounds including high atomic number (Z) elements are the most suitable for X-ray absorption since the absorption is proportional to $Z^3$.

Figure 7:
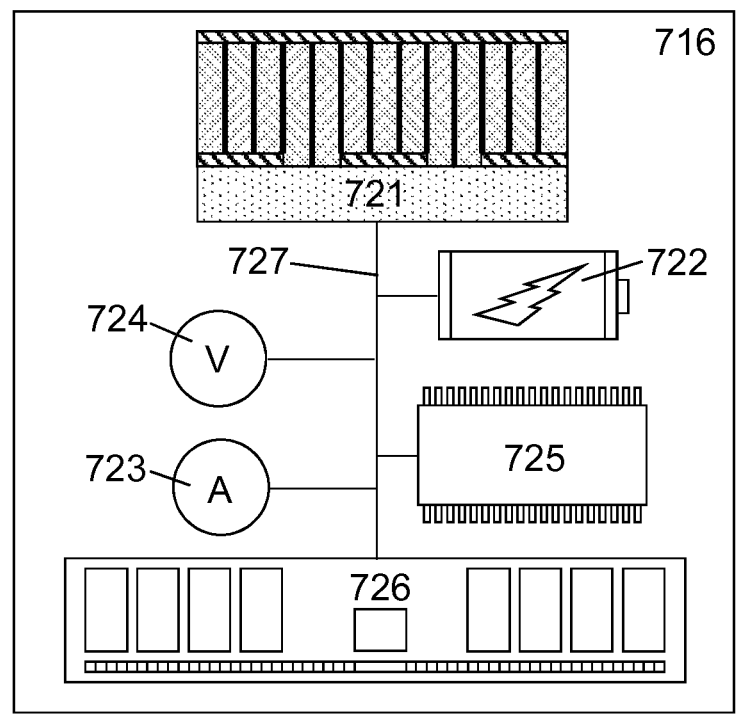
FIG. 7 illustrates schematically another example of the present apparatus.

FIG. 7 shows another example of the present apparatus 716. The apparatus 716 may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a sensor, a camera, an image sensor, a photodetector, a phototransistor and a module for one or more of the same. In the example shown, the apparatus 716 comprises the components described previously (denoted by reference numeral 721), a power source 722, an ammeter 723, a voltmeter 724, a processor 725 and a storage medium 726, which are electrically connected to one another by a data bus 727.

The power source 722 is configured to apply a voltage between the source and drain electrodes, the voltmeter 724 is configured to measure the applied voltage, and the ammeter 723 is configured to measure the resulting current flowing through the conductive channels.

The processor 725 is configured for general operation of the apparatus 716 by providing signalling to, and receiving signalling from, the other components to manage their operation. In addition, the processor 725 is configured to receive the current measurement(s) from the ammeter 723 and determine one or more of the presence and magnitude of the incident electromagnetic radiation based on the current measurement(s) for at least one of the conductive channels. In some cases, the processor 725 may be configured to receive the voltage and current measurements from the voltmeter 724 and ammeter 723, respectively, determine an electrical property of the conductive channels (e.g. conductivity, conductance, resistivity, resistance or change therein) using the voltage and current measurements, and determine one or more of the presence and magnitude of the incident electromagnetic radiation based on this determined electrical property rather than the current measurements directly.

The storage medium 726 is configured to store computer code configured to perform, control or enable operation of the apparatus 716. The storage medium 726 may also be configured to store settings for the other components. The processor 725 may access the storage medium 726 to retrieve the component settings in order to manage the operation of the other components. The storage medium 726 may also be configured to store calibration data (e.g. predetermined measurements of intensity levels of incident electromagnetic radiation versus a corresponding electrical property) for use by the processor 725 in determining one or more of the presence and magnitude of the incident electromagnetic radiation.

The processor 725 may be a microprocessor, including an Application Specific Integrated Circuit (ASIC). The storage medium 726 may be a temporary storage medium such as a volatile random access memory. On the other hand, the storage medium 726 may be a permanent storage medium such as a hard disk drive, a flash memory, or a non-volatile random access memory.

Figure 8A:
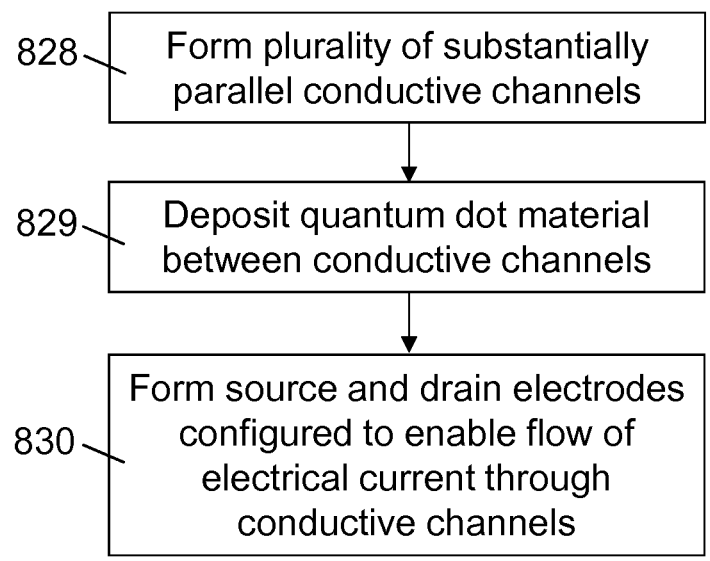
FIG. 8a illustrates schematically a method of making the present apparatus.

FIG. 8a shows the main steps 828-830 of a method of making the present apparatus. The method generally comprises: forming a plurality of substantially parallel conductive channels 828; depositing a quantum dot material between the conductive channels 829; and forming source and drain electrodes configured to enable a flow of electrical current through the conductive channels 830.

Figure 8B:
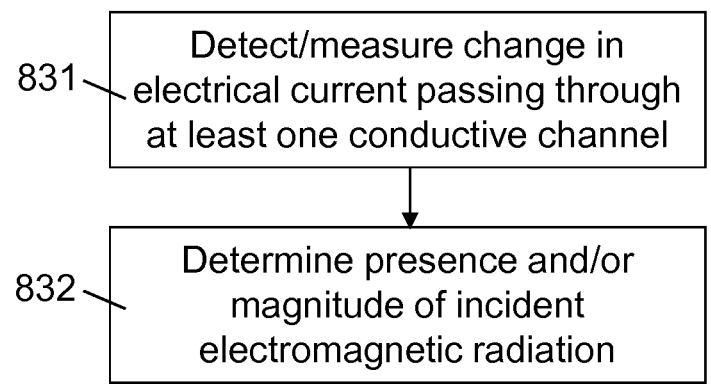
FIG. 8b illustrates schematically a method of using the present apparatus.

FIG. 8b shows the main steps 831-832 of a method of using the present apparatus. The method generally comprises: detecting/measuring a change in electrical current through at least one of the conductive channels 831; and determining one or more of the presence and magnitude of incident electromagnetic radiation based on the detected/measured change in electrical current 832.

Figure 9:
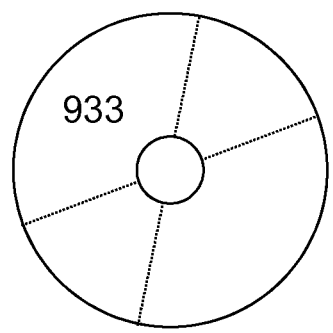
FIG. 9 shows a computer-readable medium comprising a computer program configured to perform, control or enable the method of FIG. 8a and/or 8b.

FIG. 9 illustrates schematically a computer/processor readable medium 933 providing a computer program according to one embodiment. The computer program comprises computer code configured to perform, control or enable one or more of the method steps 828-830, 831-832 of FIG. 8a and/or 8b. In this example, the computer/processor readable medium 933 is a disc such as a digital versatile disc (DVD) or a compact disc (CD). In other embodiments, the computer/processor readable medium 933 may be any medium that has been programmed in such a way as to carry out an inventive function. The computer/processor readable medium 933 may be a removable memory device such as a memory stick or memory card (SD, mini SD, micro SD or nano SD).

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising:
    a plurality of substantially parallel conductive channels separated from one another by a quantum dot material comprising a plurality of quantum dots separated from one another by ligands having a chain length which is sufficiently short to facilitate transfer of an electron or a hole between neighboring quantum dots,
    source and drain electrodes configured to enable a flow of electrical current through the conductive channels, and
    a substrate configured to support the conductive channels, quantum dot material and source and drain electrodes, the conductive channels extending substantially perpendicular to the surface of the substrate,
    wherein the quantum dot material is configured to generate an electron-hole pair on exposure to incident electromagnetic radiation, and wherein the conductive channels and quantum dot material are configured such that another one of the electron or the hole of the electron-hole pair is transferred to one of the conductive channels leaving the remaining charge carrier in the quantum dot material, a diffusion length of the remaining charge carrier is limited by a dimension of the conductive channels rather than a thickness of the quantum dot material, the remaining charge carrier exhibiting an electric field which causes a change in electrical current passing through at least one of the conductive channels, the change in electrical current indicative of one or more of the presence and magnitude of the incident electromagnetic radiation.

2. The apparatus of claim 1, wherein the apparatus comprises a plurality of source and drain electrode pairs, each pair of source and drain electrodes configured for use with one or more channels.

3. The apparatus of claim 2, wherein the apparatus comprises a plurality of source electrodes each configured for use with a respective drain electrode.

4. The apparatus of claim 2, wherein the apparatus comprises a plurality of source electrodes each configured for use with the same drain electrode, or a plurality of drain electrodes each configured for use with the same source electrode.

5. The apparatus of claim 2, further comprising a read-out circuit configured to address each pair of source and drain electrodes individually.

6. The apparatus of claim 5, wherein the read-out circuit comprises one or more of a thin-film transistor and a complementary metal-oxide-semiconductor transistor.

7. The apparatus of claim 1, wherein the source and drain electrodes each have a substantially planar configuration and are connected to opposite longitudinal ends of the conductive channels, and wherein the conductive channels extend substantially perpendicular to the respective planes of the source and drain electrodes.

8. The apparatus of claim 1, wherein either the source electrode(s) or drain electrode(s) are formed on the substrate.

9. The apparatus of claim 1, wherein the conductive channels extend substantially vertically during use of the apparatus in determining one or more of the presence and magnitude of the incident electromagnetic radiation.

10. The apparatus of claim 1, wherein the conductive channels and quantum dot material together form a layer of composite material having a thickness of greater than 1 µm, 10 µm, 100 µm or 1 mm.

11. The apparatus of claim 1, wherein the conductive channels are laterally spaced apart from one another by no more than 10 nm, 25 nm, 50 nm, 100 nm, 200 nm, 500 nm or 1 µm.

12. The apparatus of claim 1, wherein the quantum dot material is configured to generate the electron-hole pair on exposure to one or more of the following types of electromagnetic radiation: x-rays, visible light, ultraviolet light and infrared radiation.

13. The apparatus of claim 1, wherein each conductive channel is formed from a respective carbon nanotube, and wherein the quantum dot material is further provided within the carbon nanotubes.

14. The apparatus of claim 1, wherein the ligands have a chain length of no more than 0.1 nm, 0.25 nm, 0.5 nm, 0.75 nm, 1 nm or 1.25 nm.

15. The apparatus of claim 1, wherein the ligands comprise one or more of 1,2-ethanedithiol, methylamine, ethylamine, ethylene diamine, ethanethiol, propanethiol, 1,3-benzenedithiol, hydrazine, formic acid, oxalic acid, acetic acid, pyridine, butylamine, formamide, $SnS_4$, $PbBr_2$, $PbI_2$, $PbCl_2$, $Na_2S.9H_2O$ and KOH.

16. A method of making an apparatus, the method comprising:
    forming a plurality of substantially parallel conductive channels on a substrate such that the conductive channels extend substantially perpendicular to a surface of the supporting substrate;
    depositing a quantum dot material between the conductive channels, the quantum dot material comprising a plurality of quantum dots separated from one another by ligands having a chain length which is sufficiently short to facilitate transfer of an electron or a hole between neighboring quantum dots; and
    forming source and drain electrodes configured to enable a flow of electrical current through the conductive channels, wherein the quantum dot material is configured to generate an electron-hole pair on exposure to incident electromagnetic radiation, and wherein the conductive channels and quantum dot material are configured such that either the electron or the hole of the electron-hole pair is transferred to one of the conductive channels leaving the remaining charge carrier in the quantum dot material, a diffusion length of the remaining charge carrier is limited by a dimension of the conductive channels rather than a thickness of the quantum dot material, the remaining charge carrier exhibiting an electric field which causes a change in electrical current passing through at least one of the conductive channels, the change in electrical current indicative of one or more of the presence and magnitude of the incident electromagnetic radiation.

17. The method of claim 16, further comprising forming either the source electrode(s) or drain electrode(s) on a substrate, the substrate further configured to support the conductive channels, quantum dot material and source and drain electrodes.

18. The method of claim 16, further comprising forming each conductive channel from a respective carbon nanotube, and providing the quantum dot material within the carbon nanotubes.

19. A non-transitory computer readable medium comprising program instructions for causing an apparatus comprising a plurality of substantially parallel conductive channels separated from one another by a quantum dot material, and source and drain electrodes configured to enable a flow of electrical current through the conductive channels, wherein the quantum dot material comprises a plurality of quantum dots separated from one another by ligands having a chain length which is sufficiently short to facilitate transfer of an electron or an electron hole between neighboring quantum dots, the quantum dot material configured to generate charge on exposure to incident electromagnetic radiation, the generated charge producing an electric field which causes a change in electrical current passing through at least one of the conductive channels, the change in electrical current indicative of one or more of the presence and magnitude of the incident electromagnetic radiation, to perform:
    determining one or more of the presence and magnitude of incident electromagnetic radiation based on a detected/measured change in electrical current passing through at least one of the conductive channels.

* * * * *

UNITED STATES PATENT AND TRADEMARK OFFICE
CERTIFICATE OF CORRECTION

PATENT NO. : 10,367,112 B2
APPLICATION NO. : 15/575158
DATED : July 30, 2019
INVENTOR(S) : White et al.

Page 1 of 1

It is certified that error appears in the above-identified patent and that said Letters Patent is hereby corrected as shown below:

In the Claims

Column 14
Line 1, reads "benzenedithiol, hydrazine, formic acid, oxalic acid, acetic" should read
--benzenedithiol, hydrazine, formic acid, acetic--

Signed and Sealed this
Eleventh Day of February, 2020

Andrei Iancu
*Director of the United States Patent and Trademark Office*